(12) United States Patent
Blumrich et al.

(10) Patent No.: US 9,244,759 B2
(45) Date of Patent: Jan. 26, 2016

(54) ERROR RECOVERY TO ENABLE ERROR-FREE MESSAGE TRANSFER BETWEEN NODES OF A COMPUTER NETWORK

(71) Applicant: International Business Machines Corporation, Armonk, NY (US)

(72) Inventors: Matthias A. Blumrich, Ridgefield, NY (US); Paul W. Coteus, Yorktown Heights, NY (US); Dong Chen, Croton on Hudson, NY (US); Alan Gara, Mount Kisco, NY (US); Mark E. Giampapa, Irvington, NY (US); Philip Heidelberger, Cortlandt Manor, NY (US); Dirk Hoenicke, Ossining, NY (US); Todd Takken, Brewster, NY (US); Burkhard Steinmacher-Burow, Wenau (DE); Pavlos M. Vranas, Bedford Hills, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/148,348

(22) Filed: Jan. 6, 2014

(65) Prior Publication Data
US 2014/0122980 A1 May 1, 2014

Related U.S. Application Data

(62) Division of application No. 13/101,566, filed on May 5, 2011, now Pat. No. 8,626,957, which is a division of application No. 11/572,372, filed as application No. PCT/US2005/025616 on Jul. 18, 2005, now Pat. No. 8,001,280.

(60) Provisional application No. 60/589,076, filed on Jul. 19, 2004.

(51) Int. Cl.
*G06F 15/16* (2006.01)
*G06F 11/08* (2006.01)
(Continued)

(52) U.S. Cl.
CPC ...... *G06F 11/08* (2013.01); *G06F 9/46* (2013.01); *G06F 11/1423* (2013.01); *H03M 13/09* (2013.01); *H04L 1/0061* (2013.01); *H04L 1/1607* (2013.01)

(58) Field of Classification Search
CPC ............ H04L 1/00; H04L 1/16; H04L 12/56; H04L 12/28; H03M 13/09; H03M 13/03
USPC ............... 709/203; 714/748, 799, 2, 752, 758
See application file for complete search history.

(56) References Cited

U.S. PATENT DOCUMENTS 4,862,461 A * 8/1989 Blaner .......................... 714/749
5,414,700 A   5/1995 Yang et al.
(Continued)

FOREIGN PATENT DOCUMENTS

TW          200506723 A    2/2005

*Primary Examiner* — Frantz Jean
(74) *Attorney, Agent, or Firm* — Scully, Scott, Murphy & Presser, P.C.; Daniel P. Morris, Esq.

(57) ABSTRACT

An error-recovery method to enable error-free message transfer between nodes of a computer network. A first node of the network sends a packet to a second node of the network over a link between the nodes, and the first node keeps a copy of the packet on a sending end of the link until the first node receives acknowledgment from the second node that the packet was received without error. The second node tests the packet to determine if the packet is error free. If the packet is not error free, the second node sets a flag to mark the packet as corrupt. The second node returns acknowledgement to the first node specifying whether the packet was received with or without error. When the packet is received with error, the link is returned to a known state and the packet is sent again to the second node.

7 Claims, 3 Drawing Sheets

(51) Int. Cl.
*H03M 13/09* (2006.01)
*G06F 9/46* (2006.01)
*G06F 11/14* (2006.01)
*H04L 1/00* (2006.01)
*H04L 1/16* (2006.01)

(56) References Cited

U.S. PATENT DOCUMENTS

| | | | |
|---|---|---|---|
| 5,442,637 A | 8/1995 | Nguyen | |
| 5,721,921 A | 2/1998 | Kessler et al. | |
| 5,835,602 A | 11/1998 | Lang | |
| 5,892,924 A * | 4/1999 | Lyon et al. | 709/245 |
| 5,956,168 A | 9/1999 | Levinson et al. | |
| 6,021,113 A | 2/2000 | Doshi et al. | |
| 6,295,597 B1 | 9/2001 | Resnick et al. | |
| 6,556,577 B2 | 4/2003 | Rjalmtysson et al. | |
| 7,444,385 B2 | 10/2008 | Blumrich et al. | |
| 7,673,011 B2 | 3/2010 | Archer et al. | |
| 2001/0043603 A1 | 11/2001 | Yu | |
| 2003/0067903 A1 | 4/2003 | Jorgensen | |
| 2004/0068599 A1 | 4/2004 | Blumrich et al. | |
| 2004/0073590 A1 | 4/2004 | Blumrich et al. | |
| 2004/0078493 A1 | 4/2004 | Blumrich et al. | |
| 2004/0081155 A1 | 4/2004 | Bhanot et al. | |
| 2004/0103218 A1 | 5/2004 | Blumrich et al. | |
| 2005/0081078 A1 | 4/2005 | Blumrich et al. | |
| 2006/0248208 A1 * | 11/2006 | Walbeck et al. | 709/230 |
| 2007/0067046 A1 * | 3/2007 | Berg | 700/1 |

* cited by examiner

US 9,244,759 B2

ERROR RECOVERY TO ENABLE ERROR-FREE MESSAGE TRANSFER BETWEEN NODES OF A COMPUTER NETWORK

CROSS REFERENCE TO RELATED APPLICATIONS

This application is a divisional of U.S. patent application Ser. No. 13/101,566, filed May 5, 2011, now U.S. Pat. No. 8,626,957, issued Jan. 27, 2014, which is a divisional of U.S. application Ser. No. 11/572,372, filed Dec. 17, 2007, now U.S. Pat. No. 8,001,280 issued Aug. 16, 2011, which is a National Stage entry of PCT/US05/25616, filed Jul. 18, 2005. The entire contents and disclosures of U.S. patent application Ser. Nos. 13/101,566 and 11/572,372 are hereby incorporated herein by reference.

This application claims the benefit of commonly owned, co U.S. Provisional Patent Application No. 60/589,076, filed Jul. 19, 2004, entitled "The Bluegene/L Tree Network," the entire disclosure of which is expressly incorporated by reference herein as if fully set forth herein.

This application is a continuation-in-part of commonly owned, U.S. patent application Ser. No. 10/469,000, filed Feb. 25, 2002, entitled "Global Tree Network For Computing Structure," now U.S. Pat. No. 7,650,434, issued Jan. 19, 2016, the entire disclosure of which is expressly incorporated by reference herein as if fully set forth herein.

This patent application is additionally related to the following commonly-owned, U.S. Patent Applications, the entire contents and disclosures of each of which is expressly incorporated by reference herein as if fully set forth herein:

U.S. patent application Ser. No. 10/468,991, filed Feb. 25, 2002, for "Arithmetic Functions In Torus And Tree Network", now U.S. Pat. No. 7,313,582, issued Dec. 25, 2007;

U.S. patent application Ser. No. 10/468,993, filed Feb. 25, 2002, for "Novel Massively Parallel Supercomputer", now U.S. Pat. No. 7,555,566, issued Jun. 30, 2015;

U.S. patent application Ser. No. 10/468,996, filed Feb. 25, 2002, for "Fault Isolation Through No-Overhead Link Level CRC", now U.S. Pat. No. 7,210,088, issued Apr. 24, 2007;

U.S. patent application Ser. No. 10/468,997, filed Feb. 25, 2002, for "Global Interrupt And Barrier Networks", now U.S. Pat. No. 7,444,385, issued Oct. 28, 2008;

U.S. patent application Ser. No. 10/468,999, filed Feb. 25, 2002, for "Class Network Routing", now U.S. Pat. No. 7,587,516, issued Sep. 8, 2009;

U.S. patent application Ser. No. 10/674,952, filed Sep. 10, 2003, for "Deterministic Error Recovery Protocol", now U.S. Pat. No. 7,149,920, issued Dec. 12, 2006; and U.S. patent application Ser. No. 11/106,069, filed Apr. 14, 2005, for "Fault Isolation In Highly Parallel Computers Using Network Injection Checksums", now U.S. Pat. No. 7,383,490, issued Jun. 3, 2008.

STATEMENT OF GOVERNMENT RIGHTS

The invention described in this application was made with U.S. Government support under U.S. Government contract B517552 awarded by the U.S. Department of Energy, and the U.S. Government has certain rights in the invention.

BACKGROUND OF THE INVENTION

1. Field of the Invention

This invention relates generally to the field of distributed-memory message-passing parallel computer design and system software, and more particularly, to a novel method and apparatus for interconnecting individual processors for use in a massively-parallel, distributed-memory computer, for example.

2. Discussion of the Prior Art

Massively parallel computing structures (also referred to as "ultra-scale computers" or "supercomputers") interconnect large numbers of processing nodes, generally, in the form of very regular structures, such as grids, lattices or tori. One problem commonly faced on such massively parallel systems is the efficient computation of a collective arithmetic or logical operation involving many nodes. One example of a common computation involving collective arithmetic operations over many processing nodes is iterative sparse linear equation solving techniques that require a global inner product based on a global summation. Such a collective computation is not implemented in the hardware of conventional networks. Instead, the collective computation involves software on each processing node to treat each packet in the computation, the latency of which can be on the order of 100 times that of an equivalent hardware treatment. Furthermore, there may be insufficient processing power for the software treatment to keep up with the network bandwidth. In addition, the topology of a conventional, multi-purpose network may reduce the efficiency of a collective computation, which is based on the longest path from any processing node involved in the computation to the processing node where the final result is produced.

A second problem commonly faced on massively-parallel systems is the efficient sharing of a limited number of external I/O connections by all of the processing nodes. Typically, this sharing is handled by assigning processing nodes to act as middlemen between the external connections and other processing nodes. These nodes can either be dedicated to the job of handling input/output (I/O), or they can perform application computations as well. In either case, the network traffic caused by I/O can be disruptive because it is often asynchronous with respect to the application's communication. For example, massively parallel systems often output checkpoints or partial results while a computation is in progress. A second drawback of sharing a single network between I/O and application communication is that the I/O bandwidth is limited to the bandwidth of the shared network. A third drawback is that the topology of a shared network may restrict the freedom to use an optimal number of dedicated I/O processing nodes or locate them optimally. For example, many massively-parallel systems use a grid interconnect because it is a regular and scalable topology. In order not to disrupt the regularity, which is good for applications, dedicated I/O processing nodes are usually located at the edges of the grid, which is relatively far from processing nodes at the center of the grid. In a torus interconnect, dedicated I/O processing nodes may need to occupy an entire row of the torus in order not to affect the regularity of the structure.

While the three-dimensional torus interconnect computing structure 10 shown in FIG. 1 comprising a simple 3-dimensional nearest neighbor interconnect which is "wrapped" at the edges, works well for most types of inter-processor communication, it does not perform as well for collective operations such as reductions, where a single result is computed from operands provided by each of the compute nodes 12, or efficient sharing of limited resources such as external I/O connections (not shown).

It would thus be highly desirable to provide a network architecture that comprises a unique interconnection of processing nodes optimized for efficiently and reliably performing many classes of operations including those requiring global arithmetic operations such as global reduction computations, data distribution, synchronization, and limited resource sharing. A dedicated network that efficiently supports collective communication patterns serves these needs well.

The normal connectivity of high-speed networks such as the torus are simply not fully suited for this purpose because of longer latencies and because of the disruptive nature of I/O. That is, mere mapping of a collective communication pattern onto the physical torus interconnect results in a tree-shaped pattern of greater depth than is necessary if adjacent nodes of the tree-shaped pattern are required to be adjacent on the torus, or a tree with longer latency between nodes when those nodes are not adjacent in the torus. In order to compute collective operations most efficiently and support simultaneous application messaging and I/O transfers, a dedicated collective network is required.

SUMMARY OF THE INVENTION

It is an object of the present invention to provide a system and method for interconnecting individual processing nodes of a computer structure so that they can efficiently and reliably compute global reductions, distribute data, synchronize, and share limited resources.

It is another object of the present invention to provide an independent single physical network interconnecting individual processing nodes of a massively-parallel, distributed-memory computer that facilitates global arithmetic and collective operations.

It is still another object of the present invention to provide an independent single physical network interconnecting individual processing nodes of a massively-parallel, distributed-memory computer that provides external (input/output) I/O and service functionality to a subset of the nodes. Such a global collective interconnect system may include dedicated I/O nodes for keeping message traffic off of a message-passing torus or grid computer structure.

According to the invention, there is provided a system and method for enabling high-speed, low-latency collective communication among interconnected processing nodes. Among other uses, such collective communications are used by parallel algorithm operations executing in a computer structure having a plurality of interconnected processing nodes. The collective network has a router device at each node. The routers are identical, which helps create computer structures with many processing nodes. Each router can be configured such that the routers act in concert to support the collective communications. As also desired for large computer structures, the collective network efficiently scales to huge numbers of nodes since only the configuration requires global coordination across nodes while each collective communication only requires actions local to each node. The collective network allows the physical network to be logically replicated as independent virtual networks. Within each virtual network, a collective communication is restricted to a subset of nodes. A subset is known as a class and many different classes can exist simultaneously. Each collective communication uses a particular virtual network and class. The collective communications include: broadcast from a root node to all the nodes, reduction from all nodes to the root node, and point-to-point message passing between any node and the root node. In addition, the collective network provides barrier and interrupt functionality across nodes in an asynchronous or synchronous manner, as discussed in U.S. patent application Publication No. US 2004/0068599 A1. When implemented in a massively-parallel supercomputing structure, the collective network is physically and logically partitionable according to the needs of a processing algorithm.

In a massively parallel computer, all of the processing nodes generally require access to external resources such as a filesystem. The problem of efficiently sharing a limited number of external I/O connections arises because the cost of providing such a connection is usually significantly higher than the cost of an individual processing node. Therefore, efficient sharing of the I/O connections ensures that I/O bandwidth does not become a limiting cost factor for system scalability. Assuming limited inter-processor interconnect, an efficient topology for sharing a single resource, in terms of average latency, is a tree, where the shared resource is at the root of the tree. The classes of the collective network can be configured as trees for such sharing.

For global collective communication, all processing nodes may be interconnected by a single, large class. However, filesystem I/O requires many, small classes, each with an external I/O facility at its root. The external connections can be uniformly located throughout the collective network so that the processing nodes can be sub-divided into distinct, appropriately-sized classes, where each class is a connected sub-network including an external connection. Simultaneously, the single, large class including all processing nodes can be defined. Additionally, filesystem I/O requires point-to-point messaging which is enabled by the present invention.

Advantageously, a scalable, massively parallel supercomputer incorporating the collective network of the invention is well-suited for parallel algorithms performed in the field of life sciences.

DETAILED DESCRIPTION OF THE PREFERRED EMBODIMENTS

Figure 1:
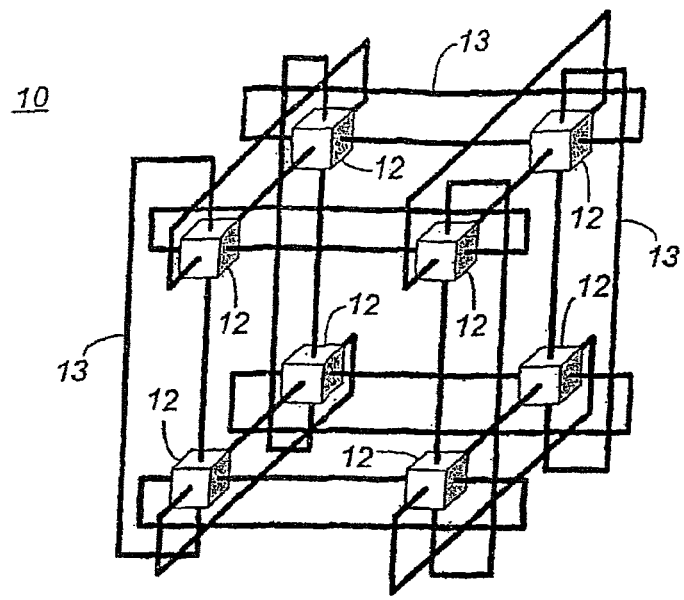
FIG. 1 depicts a three-dimensional torus interconnect computing structure.

The present invention may be implemented in a computer structure such as described in herein-incorporated, commonly-owned, U.S. patent application Publication No. US 2004/0103218 A1, which describes a novel Massively Parallel Supercomputer architecture in the form of a three-dimensional torus designed to deliver processing power on the order of teraOPS (trillion floating-point operations per second) for a wide range of applications. The Massively Parallel supercomputer architecture, in the exemplary embodiment described, comprises 65,536 processing nodes organized as a 64×32×32 three-dimensional torus with each processing node connected to six (6) neighboring nodes. FIG. 1 shows such a torus consisting of eight (8) nodes 12, and it is clear to see how this interconnect scales by increasing the number of nodes 12 along all three dimensions. With current technology, this architecture can be leveraged to hundreds of teraOPS for applications that require significantly more computation than communication or which require only nearest neighbor communications. It should be understood that the present invention may be implemented in many other computer structures besides a supercomputer.

As mentioned, the interconnect network connecting the torus processing nodes works well for most types of inter-processor communication but not for collective operations such as reductions, where a single result is computed from operands provided by each of the processing nodes. As described in herein incorporated commonly-owned, U.S. patent application Publication No. US 2004/0073590 A1 entitled "Arithmetic Functions in Torus and Tree Networks," an efficient mechanism for performing a collective reduction operation on the torus, in terms of minimum latency, is to provide a logical tree communication pattern, i.e., the physical interconnections that carry messages during the reduction form a tree of the processing nodes that compute the reduction. However, the same nodes could be connected by a physical tree or tree-like network of lesser depth than the logical tree embedded in the torus network, resulting in a reduction with higher performance.

Thus, according to a preferred embodiment of the invention, a collective network is provided that comprises a plurality of interconnected router devices, one per node ASIC. Each router provides three (3) ports for connecting to other routers, and each port is selectively enabled. Three ports are sufficient to create a network with the topology of a connected graph, upon which a collective tree communication pattern can be established. The tree pattern is efficient for performing collectives. More ports reduce the height of such a tree (i.e. the maximum number of connections required to reach the root). Thus, more ports can reduce the latency for collective operations at the expense of more interconnections. While the collective network of the preferred embodiment is constructed with three-port routers, it should be understood that the invention applies equally well to networks constructed with routers having more than three ports.

Just as the torus network of the massively parallel supercomputer is partitionable into multiple, independent tori, the collective network is also partitionable into multiple, independent collective networks, each with the same functionality as the whole. That is, the machine can be partitioned into multiple, physically independent machines, each with a complete torus and a complete collective network. It should be understood that references to the global collective network herein refer equally to the collective network of a partition as to the un-partitioned collective network of the entire machine.

As will be described in greater detail, the collective network may include a number of independent "virtual networks", supported by virtual channels on the links interconnecting the ports of routers (nodes). In order to share the links, virtual network data streams are packetized and interleaved in a fair manner. Each of the virtual networks has its own storage resources, and a functional deadlock in one will not affect the other.

As will be described in greater detail, the collective network supports sixteen (16) individual "classes", each of which defines a collective communication pattern utilizing a subset of the processing nodes of the physical network. A class may consist of multiple, non-overlapping subsets of nodes, each of which operates independently, as will be described in greater detail herein. In the preferred embodiment, classes define collective communication patterns with a tree topology.

The paths of such a "tree-shaped" class can be formed by starting with a "root" node, which constitutes the topmost "level" of the tree. The next level down consists of one or more nodes that are connected to the ports of the root node (i.e. neighboring nodes). In this case, the root node is the "parent" of the nodes in the level below it, and the nodes in the level below are known as "children" of the node in the level above them. This process continues recursively (i.e. the children of the root node each build a tree with themselves as root) until nodes are reached that have no children (i.e., none of their ports is connected to a node that is not already part of the tree class). These nodes are referred to as the "leaves" of the tree. For instance, as shown in the example collective network 100 of FIG. 2, node 110 is a root node, and nodes 112 and 115 are leaf nodes. As referred to herein, data moving up the tree-shaped class, toward the root, is referred to as "uptree" traffic while data traveling down the tree-shaped class, away from the root and toward the leaves, is referred to as "downtree" traffic.

Nodes may be configured to participate in any number of classes, or none. If they participate, then they are expected to follow all class semantics, such as contributing operands to reduction operations and removing results. As nodes may participate in multiple classes, they must specify a class number for every packet they inject into the network.

Figure 2:
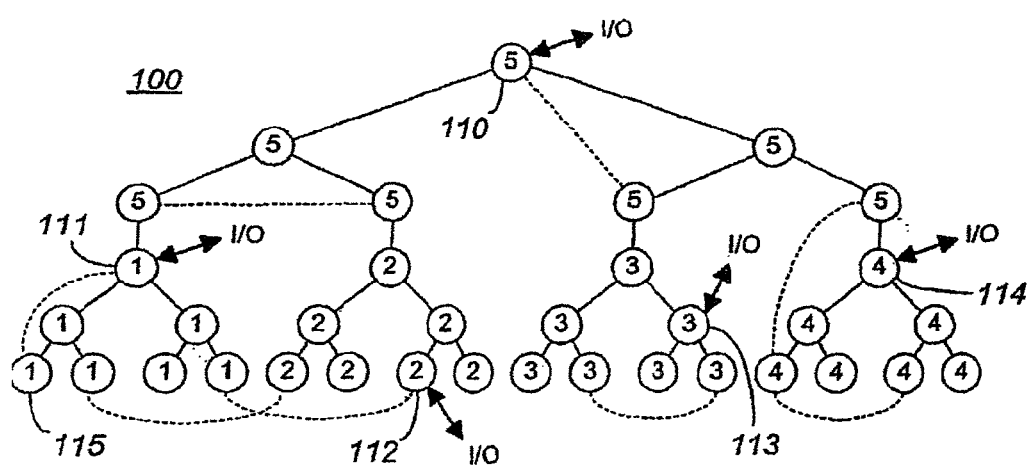
FIG. 2 shows an example collective network structure used in accordance with this invention.

An example collective network structure 100 used in accordance with the invention is shown in FIG. 2. More particularly, FIG. 2 depicts an example of a collective network including thirty-five (35) nodes (represented by circles), and a network 100 (represented by both the solid and dashed lines between circles) connecting all of the 35 nodes. The collective network 100 has a global tree-shaped class mapped onto it (represented by the solid lines between circles), which is used for global reduction and broadcast as will be described in greater detail below.

For the purpose of input/output (I/O) and resource sharing with external systems, the nodes of the example collective network 100 of FIG. 2 are grouped into five (5) non-overlapping classes with tree topologies referenced in FIG. 2 as classes 1-5. That is, each of the classes is indicated by a different number within the circles, and the tree topologies consist of the interconnections indicated by solid lines between circles with the same number. The respective nodes 111, 112, 113, 114 and node 110 at the root of each respective class 1-5 include an interface, or I/O, connection to the external system (e.g. host or file system). Therefore, each I/O connection handles all the external traffic for the seven (7) nodes of the class whose root it is connected to. In the preferred embodiment, the node at the root of each class is dedicated to I/O. However, this is not always required.

Referring to FIG. 2 and class number 1, a typical node 115 desiring to send data out of the computer structure passes a message up to the root node 111 of the class, where it is forwarded to an external connection. Data arriving on the external network connection may be forwarded to a particular node such as 115 by using a broadcast filter that filters out all other nodes, as described in greater detail herein. Further details regarding the operation of the collective network, particularly with respect to functionality supporting configurable point-to-point messaging used for input/output, program load, system management, parallel job monitoring and debug can be found in herein-incorporated, commonly-owned, U.S. patent application Publication Nos. US 2004/0081155 A1, US 2004/0078493 A1, and US 2004/0068599 A1.

Referring back to FIG. 2, I/O traffic generally remains within the classes that have an external connection at their roots. However, if an external connection fails, another node with an external connection may be used for fail-over. For example, if the external I/O connection at the root 111 of class number 1 in FIG. 2 fails, then all of the nodes in class number 1 can communicate with the external filesystem or host system through the root 110 of class number 5. This is accomplished by merging the two classes into one larger class with node 110 at the root.

Referring to FIG. 2, the collective network 100 includes connections that are not utilized by the configured classes (represented by the dashed lines between circles), but are otherwise equivalent to the utilized connections. They are not utilized simply because they were not chosen to be part of the tree topology of any class. That is, the physical collective network is topologically a graph which includes cycles, and embedding tree-shaped classes can cause some of the connections to be un-utilized. However, the un-utilized connections can be used for failover. That is, if one of the utilized connections fails, then all classes that use the failed connection can be re-configured, so long as the network remains connected. For example, if node 115 of class number 1 becomes disconnected, the class can be re-configured with the connection between node 115 and node 111 utilized.

Referring back to FIG. 2, all of the solid lines between circles (including those between classes 1-5) indicate a global tree communication topology involving all thirty-five (35) nodes of the collective network 100. This communication pattern is used by a class that includes all of the nodes for global collectives such as reduction and broadcast. Note that the global class must use a class number other than 1-5, used, in this example, for the I/O classes.

In the preferred embodiment, the collective network of the present invention comprises interconnected routers, one per node, that each move data as well as compute collective reductions. It should be understood that the reductions which can be computed include, but are not limited to, integer addition, integer maximum, bitwise logical AND, bitwise logical OR, bitwise logical XOR (exclusive OR), and broadcast. The functions are implemented in a low-latency manner. For example, the addition function has the lowest-order 16-bit word of an operand sent first on the collective network. This low word is immediately added to the other words from the other sources (in hardware) with the result being shifted out to the next higher level of the class tree. In this way, an 8-byte operand, for example, has already progressed up several levels before the high-order word is shifted out. This results in the possibility for a very low latency addition over the entire machine. As is explained in U.S. patent application Publication No. US 2004/0073590 A1 entitled "Arithmetic Functions in Torus and Tree Networks", other arithmetic functions such as minimum and subtraction can be accomplished by suitable preconditioning of the data. Floating point summation can also be accomplished by two passes on the collective network, all at very low latency compared to other methods. As will be further described, in a collective reduction the communication flows towards the root node up the class tree, during which operands and partial results are combined. The final result is achieved at the root node. The communication flow may continue from the root node back down the class tree, distributing the result to all processing nodes in the class. As will be described, processing nodes within the class can be omitted from the calculation in a controlled fashion. Such nodes just connect other members of the class.

Figure 3:
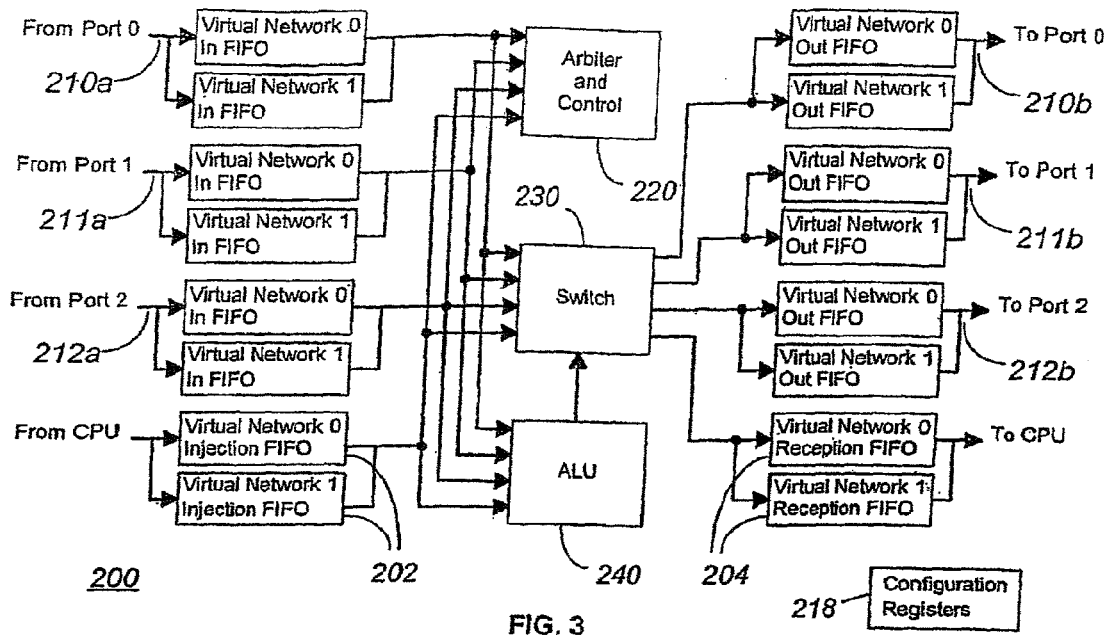
FIG. 3 illustrates the basic architectural components of a router device for the collective network of FIG. 2.

FIG. 3 illustrates the basic architectural components of a router device 200 for the collective network of FIG. 2, as well as the major datapaths connecting the components. As shown in FIG. 3, each router device 200 includes a number of ports, e.g. three, that may either be connected to another router, or disabled when not connected. As shown in FIG. 3, the router has three input ports 210a-212a and corresponding three output ports 210b-212b. In one embodiment, the router 200 is configured within a class with a tree topology, where one of the three ports may be enabled to communicate with a parent node, and up to three of the ports may be enabled to communicate with child nodes. A leaf node at the bottom of the tree will have only the one port enabled to communicate with its parent node, while the root of the tree will have no parent, but possibly all three ports enabled to communicate with children. FIG. 3 assumes two virtual networks. Since each virtual network is largely independent, the generalization to other numbers of virtual networks is obvious.

For purposes of description, in the router device 200 of FIG. 3, data always flows from left to right. Thus, a packet may enter the router device 200 from either a local injection First-In First-Out (FIFO) buffer 202 or, one of the router's input ports 210a-212a. If the packet enters a port, then it is placed into one of two input FIFOs (e.g., 0 or 1) depending on which of the two virtual networks it is traveling in. A packet never switches virtual networks. The packet is eventually consumed by either logic and arithmetic operations executed by ALU unit 240, or the switch 230. The ALU unit 240 combines multiple packets to produce a single reduction result which is routed to the switch 230. The switch 230 is a crossbar that can broadcast each of its inputs to one or more of its outputs.

The movement of packets through the router 200 is orchestrated by the Arbiter and Control unit 220. When packets arrive at the input ports 210a-212a or the injection FIFOs 202, the Arbiter and Control unit 220 is notified. Packets within the network are routed using virtual cut-through routing, so the Arbiter and Control unit is notified as soon as a packet begins to arrive at an input port 210a-212a. Based upon predefined routing and reduction configurations described in greater detail herein, the Arbiter and Control unit 220 configures the Switch 230 and ALU 240 units to either route a packet from a single input 210a-212a, 202 to one or more outputs 210b-212b, 204, or combine packets from several inputs and route the result to one or more outputs. On each clock cycle, the Arbiter and Control unit 220 makes one such routing decision and starts a packet transfer through the router from one or more data "sources" to one or more data "sinks". When possible, multiple transfers can occur simultaneously. For example, the router may be configured within a tree-shaped class where Port 0 is connected to a parent node while ports 1 and 2 are connected to child nodes. A reduction may be progressing up the tree from input ports 1 and 2 and the CPU injection to output port 0 while a simultaneous broadcast of the result is progressing from input port 0 to output ports 1 and 2 and the CPU reception.

A packet transfer across the router may not complete for several reasons. The transfer protocol allows any source of data or any sink to cancel the transfer before it completes, and any such cancellation is recoverable. If a source cancels the transfer, then all sources and sinks will be notified that the transfer has ended and will react accordingly. The sources will reset their state so that the same transfer can be repeated, and the sinks will either delete the partial packet if it is stored in a FIFO buffer, or complete the transfer with dummy data and mark the affected outgoing packet as known-bad. As described below, such a known-bad packet is deleted by a subsequent node. If a sink cancels the transfer, then the transfer continues to all other sinks while the terminating sink becomes available for other transfers. This is used, for example, by the reception interface 204 when it detects a point-to-point packet with a non-matching address, as described in greater detail herein.

Software access to the collective network is provided by the injection 202 and reception 204 interfaces, and a set of configuration registers 218. In general, the configuration registers 218 are used to configure the router and determine its status, while the injection and reception interfaces 202, 204 are used by applications to provide operands and receive results, respectively. Data is sent into the network by being stored as packets into the injection interface 202, either explicitly or through direct memory access (DMA). Similarly, results are removed from the network by being read as packets from the reception interface 204, either explicitly or through DMA.

In the preferred embodiment, each of the FIFOs 210a-212a, 210b-212b, 202, 204 in FIG. 3 actually consists of two separate FIFOs, one for headers and one for payloads. The FIFO pairs are synchronized so that they appear to form a single FIFO that stores complete packets. Separating the header and payload FIFOs is a particular advantage for the injection 202 and reception 204 interfaces. This allows headers and payloads to be injected and received independently of one another so that the router can be used by a processor with a weakly-ordered memory system interface. In particular, the processor of the preferred embodiment transfers headers from general-purpose registers and payloads from floating-point registers, and provides no ordering guarantee between stores from each of the register types. Therefore, a header which is stored first may actually arrive at the injection interface 202 after some payload words which were stored later. The hardware of the injection interface 202 compensates for this possibility by matching headers and payloads, and considering a packet injected only when a header and complete payload have been injected. Similarly, the reception interface 204 considers a packet to have been read only when the header and complete payload have been read from a reception FIFO pair.

Each router has a Class Configuration Register 218 for every class. In order to create a class route, appropriate values are stored into the Class Configuration Registers for that class on every node. The details of class routing and the use of the Class Configuration Registers can be found in U.S. patent application Publication No. US 2004/001155 A1 entitled "Class Network Routing." Briefly, the routing algorithm treats the local processor interface 202, 204 as a fourth port, so it routes equivalently from the FIFOs on the left-hand side of FIG. 3 to those on the right-hand side. A Class Configuration Register designates each of these four ports as a "source", a "target" or both. Packets entering on a link designated as a source are routed to all targets; otherwise they are routed to all sources. In addition, collective combine packets arriving on a source port wait for similar packets on all the other source ports, which are then combined and routed to all targets. This simple algorithm is all that is necessary to completely specify a class and use it for collective combining, broadcast, or the combination of both in a single operation.

Figure 4:
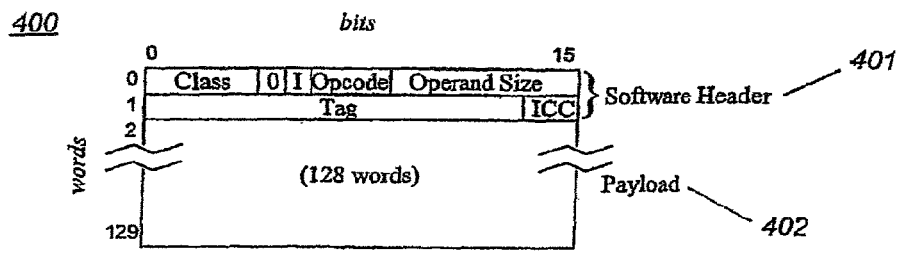
FIG. 4 shows the format of a "collective-type" packet used in the network structure of this invention.

The format of a "collective-type" packet 400 of the preferred embodiment is shown in FIG. 4. The packet consists of a 32-bit software header 401 and a 2048-bit payload 402, and is used for reduction and broadcast operations. The packet is identified as collective-type because bit 4 of the software header is set to zero (0). The "Class" field is 4 bits wide and specifies which one of the sixteen (16) classes is used to route, and possibly combine, the packet. The "I" field is 1 bit wide and specifies whether the packet will cause an interrupt when it, or any result derived from it, arrives in a reception FIFO. The "Opcode" field is 3 bits wide and specifies either one of the five reduction operations or broadcast. The "Operand Size" field is 7 bits wide and specifies the number of 16-bit words that comprise an integer operand (from 1 to 128). This field is only significant for the integer addition and integer maximum operations. In this case, the payload 402 is considered to be a vector of operands, each of which has the specified operand size. The "Tag" field is 14 bits wide and can be set to any value. This field is only valid for broadcast packets. The "ICC" field is 2 bits wide and is used to specify how the packet is added to the injection checksums, as described in greater detail herein.

Figure 5:
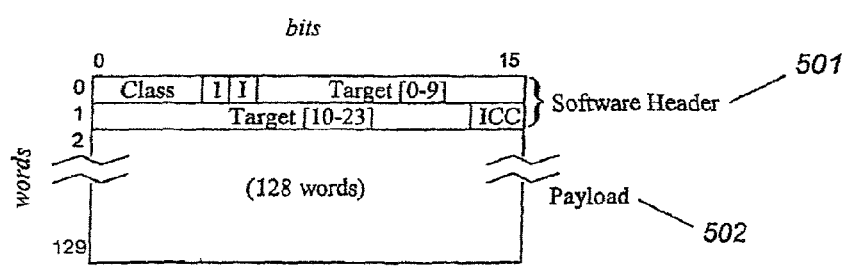
FIG. 5 shows the format of a "point-to-point type" packet used in the network structure of the invention.

FIG. 5 shows the format of a "point-to-point-type" packet 500 of the preferred embodiment, which has many similarities to the collective-type packet 400 shown in FIG. 4. The packet consists of a 32-bit software header 501 and a 2048-bit payload 502, and is used for filtered broadcast operations, as described in greater detail herein. The packet is identified as point-to-point-type because bit 4 of the software header is set to one (1). The Class, I, and ICC fields of the software header have the same function as described for the collective-type software header. The "Target" field is 24 bits wide and is used to specify the target address for broadcast filtering, as described in greater detail below.

Both collective-type and point-to-point-type packets are embedded within a link-layer packet when transferred between routers, as described in greater detail herein. Briefly, the links provide a token-based, sliding window flow control protocol that supports re-transmission of corrupted packets. Corruptions are detected by a 24-bit cyclic redundancy code that is part of the link-layer packet. Buffer depths (and hence token numbers) are sized so that all links, including those traversing the longest cables, can achieve full, sustained bandwidth when there are no errors or congestion.

As mentioned, flow control is maintained through the use of a token-based communication protocol. An "upstream" router sending packets to a "downstream" router has some number of tokens, which represent the amount of free storage capacity in the downstream router. Whenever the upstream router sends a packet, it consumes a token, and it cannot send the packet unless it has a token left. Conversely, the downstream router issues tokens to the upstream router whenever it frees storage space. The balance between storage space and packet latency ensures that the link is kept busy constantly.

The Arithmetic and Logic Unit (ALU) block 240 within the router device of the preferred embodiment is enabled to perform five reduction operations on multiple operand sizes. The operations are integer addition, integer maximum, bitwise logical OR, bitwise logical XOR, and bitwise logical AND. The operand sizes are any multiple of 16 bits ranging from 16 to 2048 bits. The ALU block 240 treats a packet as a sequential series of individual operands, performing the same reduction operation on each of the operands within the packet. It should be understood that the architecture depicted in FIG. 3 does not preclude a different choice for ALU operations or operand sizes. Particularly, software is employed for selecting the operation and operand size.

Typically, those nodes which participate in reduction operations inject collective-type packets 400 by storing them in a CPU injection FIFO 202. Reductions are performed at the granularity of packets, where a packet, according to one embodiment, carries a payload of 256 bytes, for example. An individual packet will always carry operands of the same size, and the same reduction is performed on all of the operands. Any node can be configured to have no local participation in collective communications for each class. In this case, the node will not supply any data and will not receive results for that class. Even if a node is not locally participating in a class, the node is a crucial member of the class if it connects participating members of the class.

For each tree-shaped class, the router device 200 is configured to specify which of its children will be participating in reductions. When it receives a reduction-type packet from each of its participating children and the local injection FIFO (unless the local node is not participating), it computes the specified reduction operation on the contents of the packets and sends the results as a single packet to its parent. That is, the first word of each packet is combined to produce the first word of the result packet. The second word of each packet is combined to produce the second word of the result packet, and so forth. In this manner, the global result is recursively computed up the tree, finally completing at the root node of the class as a single packet containing the results.

Preferably, any node can be configured as the root of a reduction class. Once the reduction reaches that node, the single, combined packet is either received, broadcast recursively to all of the participating children, or both. When a router receives a reduction-type packet from its parent node, it forwards copies of the packet to each of its children. It also places a copy of the packet in its local reception FIFO 204 if it is configured to participate in reductions on that class.

In a preferred embodiment, the width of the physical interconnect is narrower than the operand width, so operands are transmitted on the collective network in a serialized manner. In order to achieve the lowest possible latency, operands for integer addition are transmitted with the lowest order bits first so that results can be calculated and even forwarded as operands arrive. In this way, a result has potentially progressed up several levels of the tree before its high order bits are shifted out, resulting in very low latency over all the nodes. In contrast, the pipelined maximum operation is computed beginning with the word containing the highest order bits because numbers are found to be different based on the highest order bit in which they differ. The hardware automatically reverses injected and received addition operands so that the computation is performed from low-order to high-order bits.

The integer reductions may additionally be used to compute floating point reductions. For example, a floating point sum may be performed by utilizing the network two times, wherein the first time, the maximum of all the exponents is obtained, and in the second time, all the shifted mantissas are added.

As mentioned, the collective network 100 of the invention is an ideal structure for performing efficient broadcasts. A hardware broadcast operation is always performed from the root of the class, but any node may broadcast by first sending a collective-type message to the router device at the root node, which then starts the broadcast automatically. For the most part, broadcasts respect the rules and restrictions of reductions, but differ in their behavior when traveling towards the root. Any node may perform a broadcast of a payload by injecting a collective-type packet with the opcode field of the software header specifying broadcast. The packet travels unaltered until it reaches a node configured as the root of the specified class. There it is turned around and broadcast to all of the participating children on that class. Therefore, it will only be received by those nodes participating in reductions on that class.

Because each of the output ports 210b-212b and the processor reception interface 204 has its own buffering, broadcasts proceed in an aggressive manner. That is, if a particular output is blocked for some reason, the broadcast can proceed on other outputs while the blocked output buffers the broadcast packet until it can be sent, or is received.

Referring to FIG. 5, reception of broadcasts, according to the invention, is further controlled by filtering information included within a point-to-point-type packet 500. The filtering mechanism of the preferred embodiment functions by matching a target value (Target field in FIG. 5) included in the software header 501 to a pre-configured value stored in each router, and only receiving the packet if the values match. In general, every node in the system is assigned a unique value (address), so this broadcast filtering mechanism allows a message to be sent from the root node to a single node below it. It is also possible to use non-unique addresses to cause reception by a subset of the nodes. There are many ways in which broadcast filtering could be generalized. For example, use of a bit vector instead of an address would allow multiple, disjoint, configurable subsets of nodes to receive broadcasts.

Efficient sharing of external I/O connections is provided by the use of point-to-point-type packets and broadcast filtering. In the preferred embodiment, a subset of the nodes is configured as a class with a tree topology, and the node at the root of the class has an external I/O connection which is shared by all the nodes of the class. The root of the class is configured so that packets arriving from its children are only routed to a reception FIFO to be received. Any node wishing to send data out the external connection simply injects a point-to-point-type or collective-type broadcast packet, which travels to the root node and is received. The processor on the root node then forwards the packet out the external connection. Data arriving on the external connection may be forwarded to a particular non-root node using by sending a point-to-point-type packet with a target address that matches the intended destination node.

Any packet may be injected into the collective network with an interrupt request attached. Referring to FIG. 4 and FIG. 5, this is accomplished by setting the I field bit to one (1) in the software header 401, 501 of the packet. The eventual effect of this is to cause a maskable interrupt at every node that receives the packet or, in the case of reductions, a result computed from the packet. A reduction result will cause interrupts if any of the injected packets contributing to that result requested an interrupt.

A reduction operation can be used to perform a software barrier with the interrupt mechanism. Briefly, each node enters the barrier by clearing its interrupt flag and then contributing to the reduction. It detects the completion of the barrier by polling on the interrupt flag or receiving an interrupt. Further details regarding the operation of the global interrupt and barrier networks may be found in detail in herein-incorporated, commonly-owned, U.S. patent application Publication No. US 2004/0068599 A1, entitled "Global Interrupt and Barrier Networks."

The collective network of the invention guarantees the correct completion of operations as long as they follow basic ordering rules. That is, because packets are processed by the routers 200 in the order in which they are received, deadlock of a virtual network results if the nodes participating in operations on a class do not inject reduction operands in the same order, or fail to inject an operand packet. Similarly, deadlock may occur if two classes overlap on the same virtual network, and operand injection violates the strict ordering rule of the virtual network. Preferably, there are no ordering restrictions on broadcast operations (including point-to-point broadcast filtering), and these operations may be interleaved with reductions.

Guaranteed completion of correctly ordered operations is provided by a hardware error recovery mechanism. Briefly, each router retains a copy of every packet that it sends across a network link until it receives an acknowledgment that that packet was received with no error. A link-level, sliding window communication protocol with packet CRC is implemented, and includes a mechanism for detection of corrupted packets, and a mechanism to cause those packets to be retransmitted using the saved copy.

The link protocol is based on three packet types, each of which has a link-level frame comprised of a Link Header and a Trailer. The Link Header contains link control information required to communicate internal states between the sender and receiver on a link. This is required to keep track of the available space for data packets and to request packet retransmissions. The Trailer contains a packet cyclic redundancy code (CRC) and a "known-bad-packet" (KBP) flag. The CRC of the preferred embodiment is 24 bits, which is of sufficient length to detect multi-bit faults.

The packet CRC is used to determine whether a received packet has been corrupted or not, as is well understood by those skilled in the art. Because the collective network utilizes virtual cut-through routing, a packet that fails the link-level CRC check has typically already started transfer to another router. In this case, it is marked as corrupt by setting the KBP flag in its trailer. Known-bad packets will be silently discarded from the network as soon as they arrive entirely within any buffer, so they never really consume any buffer space. In the case of a broadcast, a known-bad packet may be replicated and arrive in many reception FIFOs, where all copies are silently deleted.

The first packet type, "data packets", contain the packets injected by software. That is, they contain collective-type (FIG. 4) or point-to-point-type (FIG. 5) packets as described previously herein.

The second packet type, "empty packets", is comprised of only the link-level frame. They are used to pass protocol control information back from receivers to senders when there is no data traffic to piggyback on. That is, each direction of a bi-directional link passes forward data and reverse control (such as acknowledgements) for the other direction. Whenever possible, the control is passed in the Link Headers of data packets traveling in the reverse direction. Otherwise, empty packets are sent.

The third packet type, "sync packets", are used to maintain logic level transitions to keep senders and receivers synchronized when there is no data traffic, as understood by those skilled in the art. This packet type is also used to re-synchronize a link in the event of an error.

The Collective Network guarantees reliable, error-free delivery of all injected packets, which is a necessary property for such a large-scale network. This guarantee is implemented by keeping a good copy of every packet on the sending end of a link until the receiving end acknowledges that it has a complete and correct copy. The link protocol uses the packet CRC to detect transmission errors. Those skilled in the art will recognize that ECC error correction could be used instead of CRCs if forward error correction is required. In the event of an error, the corrupt packet (or reduction packet including it) is marked known-bad in its Trailer, a negative acknowledgement is returned from the receiver to the sender, the link is returned to a known state, and sending begins again from the corrupt packet.

The router automatically corrects reduction operations in the presence of packet corruption by taking advantage of the storage capability of virtual cut-through routing. First, the KBP flag is propagated through the ALU, so a reduction packet that includes operands from a known-bad packet is also marked as known-bad and will never be received. Second, the detection of a corrupted packet results in a negative acknowledgement on the affected link and an acknowledgement delay on all other links that contribute to the reduction. The effect of this is to retain the known-good operand packets and request a re-transmission of the corrupted operand packet. When the re-transmitted packet arrives, the reduction computation is repeated utilizing the stored copies of the un-corrupted packets. This mechanism is repeatable in the case of multiple occurrences of transmission errors.

It should be understood by those skilled in the art that other link-level protocols, such as that described in U.S. patent application Publication No. US 2005/0081078 A1 entitled "Deterministic Error Recovery Protocol," could be used to construct a collective network. The protocol described herein has several performance optimizations such as link-level retransmission and the KBP flag.

In addition to the individual transmission error detection, the link logic also features an extra, cumulative, 32-bit link cyclic redundancy check as described in greater detail in commonly-owned, U.S. patent application Ser. No. 10/468, 996 entitled "Fault Isolation Through No-Overhead Link Level Checksums". All data crossing the link is subject to this CRC on both ends of the link. Having such a protected, long-term, cumulative CRC per link allows for periodic checks of link integrity. Any mismatch between the sender and the receiver CRC on a particular link indicates a transmission error which escaped the packet CRC check. After detection of such a CRC escape, the affected partition can be reset and computation resumed from an earlier checkpoint.

The collective network router hardware of the preferred embodiment includes circuitry to detect the occurrences of both normal (i.e. expected) and exceptional (i.e. unexpected) events. A normal event, for example, is the arrival of a virtual network 0 packet on port 2. An exceptional event, for example, is the detection of a corrupted word in a FIFO buffer. Normal and exceptional events are reported by the router to a processor by changing the state of a set of signals dedicated to this purpose. Signals reporting exceptional events are typically connected to an interrupt controller which delivers interrupts in an organized manner to a processor. Signals reporting normal events are typically connected to counters which can be used to monitor the frequency of such events. Counters with an interrupt capability can also be used to monitor exceptional events.

There are some events which are exceptional, but do not indicate an error condition. Examples of this are the injection and reception FIFO watermark events. Each injection FIFO can be configured to cause a "low watermark" event when the number of packets in the FIFO falls below a specified number. Similarly, each reception FIFO can be configured to cause a "high watermark" event when the number of packets in the FIFO rises above a specified number. These watermark events can be used by the software interface to inject and receive batches of packets in an asynchronous manner That is, watermark events resulting in exceptions cause software to periodically inject or receive batches of packets while it is busy with some other task. Another example of an exceptional event that does not indicate an error condition is the arrival of a packet with the I field bit set, as described earlier herein.

The collective network router of the preferred embodiment includes a number of features that are used for debugging and verifying the correct operation of the router. First, there is a dedicated, privileged interface that allows the contents of all FIFO buffers to be read and written. In particular, the FIFO buffers are actually built from static random access memory (SRAM) and include several bits of error correcting code (ECC) for every word of SRAM. The privileged interface allows the entire contents of the SRAMs, including the ECC bits, to be read and written. This feature is important for diagnosing causes of failure and for verifying the correct function of the ECC generation and checking logic.

Second, the router allows each of the ports to be wrapped back onto itself so that packets exiting on a port will be returned into that port. In particular, referring to FIG. 3, output port 0 210b can be wrapped back to input port 0 210a, output port 1 211b can be wrapped back to input port 1 211a, and output port 2 212b can be wrapped back to input port 2 212a. When all three ports are wrapped back, then no packets can exit the router to the network, and no packets can enter the router from the network. This feature is important for diagnosing and verifying the function of the router independent of other routers.

Third, any output port 210b-212b can be configured so that as packets pass through, the most significant bit (MSB) of the class field of their software headers is inverted. This is especially useful for single-node verification of reduction functionality when the ports are wrapped back onto themselves, because it allows one class to be used for distributing packets to the ports and the complementary class (with the MSB inverted) to be used for reducing them.

In the preferred embodiment, as described in greater detail in commonly-owned, U.S. patent application Ser. No. 11/106,069, entitled "Fault Isolation in Highly Parallel Computers Using Network Injection Checksums", and described herein with respect to FIG. 2, a collective network router maintains checksums of injected packets in order to provide fault isolation capability. The idea is to checksum the deterministic portion of all packets injected over relatively short time intervals during the run of an application that has a deterministic communication order. If there is a problem, or the validity of an application's results is in question, the collected checksums can be compared with a fresh run to determine when, or if, they differ.

In particular, for each virtual network, the hardware maintains a checksum for software headers and one for payloads. Referring to FIG. 4 and FIG. 5, the software header of every packet includes an ICC field that specifies whether that header should be added to the header injection checksum, and what portion of the corresponding payload should be added to the payload injection checksum. Options for the payload include all, none, or a pre-configured portion thereof. Configuration, sampling, and clearing the checksum counters is done through privileged registers.

The injection checksums are intended to detect transient hardware errors by comparing signatures of network sends between two runs. This is useful for identifying faulty nodes, regardless of what causes an error, assuming the network sends are deterministic and only the deterministic portions of packets are checksummed. In this case, every node becomes a black box generating identical checksums every time the application is run.

In order to increase accuracy, it is expected that the checksums are sampled and reset fairly often, at synchronized breakpoints, generating a signature consisting of a vector of checksums. When a fault occurs, the application can be run again to determine when the signatures diverge. Alternatively, the mechanism can be used to increase confidence in a result by running an application twice between checkpoints before moving forward. Although this strategy more than doubles runtime, it can be a win for long-running applications on such a large-scale machine, where the probability of a transient fault becomes relatively high.

In the preferred embodiment, as described in greater detail in commonly-owned, U.S. Patent Application Publication No. US 2004/0103218 A1 entitled "A Novel Massively Parallel Supercomputer", and described herein with respect to FIGS. 1-5, each processing node 12 is based on a system-on-a-chip process, i.e., all functions of the processing node, including the routing functions, are integrated into a single ASIC, resulting in dramatic size and power reduction for the node size. This supercomputer architecture is further leveraged to increase node density thereby decreasing the overall cost/performance for the machine. Each node preferably incorporates many such functions into the ASIC including, but not limited to: a PowerPC 440 embedded processing core, a Floating Point core, embedded DRAM, integrated external DDR memory controller, message processor, Ethernet adapter, as well as the torus and collective network routers. In one embodiment, the same ASIC may be used as an I/O node which is associated with a subset of the processing nodes, e.g. 64 nodes, for handling filesystem communication and I/O operations. That is, the I/O nodes are very similar to the processing nodes however, may differ only in the respect of external memory configuration and, in the addition of an external network interface, such as a Gigabit Ethernet, for example. It should be understood that the collective network router described herein can function as a stand-alone device in addition to the integrated device of the preferred embodiment.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

What is claimed is:

1. An error-recovery method to enable error-free message transfer between nodes of a computer network, the method comprising the steps of:

a first node of the network sending a packet to a second node of the network over a link between the first and second nodes, said packet including a header, a trailer, and control information, the trailer including means to test the packet to determine if the packet is corrupt, and a flag to indicate whether or not the packet is corrupt;

the first node keeping a copy of the packet on a sending end of the link until the first node receives an acknowledgment from the second node that the packet was received by the second node without error;

the second node testing the packet to determine if the packet is error free; and if the second node determines that the packet is not error free, then the second node setting a flag in the trailer of the packet to mark the packet as corrupt;

the second node returning an acknowledgement to the first node which specifies whether the packet was received with or without error; and when the packet is received with an error, returning the link to a known state and again sending the packet to the second node.

2. A method according to claim 1, comprising the further steps of:

the second node, upon receipt of the packet, checking the packet to determine if it is corrupt; and if the packet is corrupt, the second node setting said flag in the trailer to indicate that the packet is corrupt or discarding the packet.

3. A method according to claim 1, wherein the header of the packet includes control information to communicate information between the first and second nodes about internal states of the first and second nodes.

4. A method according to claim 3, wherein the control information includes an acknowledgement to specify whether a packet transmitted previously was received correctly or not.

5. A method according to claim 4, comprising the further step of the second node using said acknowledgement to request retransmission of the packet when the packet is determined to be corrupt.

6. The method according to claim 1, further comprising:
the second mode performing an operation using said packet and sending a result of the operation in a further packet to a third node; and
when the second node determines that the packet has an error, the second node sending a flag to the third node indicating that the further packet has an error.

7. An error recovery method to enable error-free message transfer between nodes of a computer network, the method comprising the steps of:
a first node of the network sending a packet to a second node of the network, said packet including a header a trailer, and control information, the trailer including means to test the packet to determine if the packet is corrupt, and a flag to indicate whether or not the packet is corrupt;
the first node keeping a copy of the packet until the first node receives an acknowledgment from the second node that the packet was received by the second node without error;
the second node testing the packet to determine if the packet is error free; and
if the second node determines that the packet is not error free, then the second node setting a flag in the trailer of the packet to mark the packet as corrupt;
the second node returning an acknowledgement to the first node which specifies whether the packet was received with or without error,
wherein the nodes of the network are connected together by links, and a multitude of packet types are transmitted between the nodes of the network, said multitude of packet types including:
data packets for transmitting data and control information between the nodes;
empty packets to pass control information back from one of the nodes to another of the nodes when data packets are not available to said one of the nodes; and
sync packets to maintain logic level transitions on each of the links when said each of the links is idle, and to pass control information back from one of the nodes to another of the nodes when data packets are not available to said one of the nodes.

* * * * *